(12) United States Patent
Seguin

(10) Patent No.: US 9,722,562 B1
(45) Date of Patent: Aug. 1, 2017

(54) SIGNAL ENHANCEMENTS FOR AUDIO

(71) Applicant: Google Inc., Mountain View, CA (US)

(72) Inventor: Chad Seguin, San Jose, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 14/971,890

(22) Filed: Dec. 16, 2015

(51) Int. Cl.
| | |
|---|---|
| *H04R 1/10* | (2006.01) |
| *H03G 5/16* | (2006.01) |
| *G06F 3/16* | (2006.01) |
| *H03G 5/00* | (2006.01) |
| *H04R 3/04* | (2006.01) |

(52) U.S. Cl.
CPC .............. *H03G 5/165* (2013.01); *G06F 3/16* (2013.01); *H03G 5/005* (2013.01); *H04R 3/04* (2013.01); *H04R 2460/13* (2013.01)

(58) Field of Classification Search
CPC .......... G06F 3/16; H03G 5/005; H03G 5/165; H04R 3/04; H04R 2460/13
USPC ........................................................... 381/74
See application file for complete search history.

(56) References Cited

U.S. PATENT DOCUMENTS

| | | | | | |
|---|---|---|---|---|---|
| 5,278,912 | A * | 1/1994 | Waldhauer | ............. | H03G 7/004 333/14 |
| 6,275,596 | B1 * | 8/2001 | Fretz | ................... | H04R 25/652 381/321 |
| 8,553,910 | B1 * | 10/2013 | Dong | ..................... | G02B 27/02 351/158 |
| 2007/0041595 | A1 * | 2/2007 | Carazo | ................... | H04R 17/00 381/151 |
| 2013/0051585 | A1 * | 2/2013 | Karkkainen | ......... | H04R 1/1075 381/151 |
| 2013/0156202 | A1 * | 6/2013 | Hamacher | ............ | H04R 25/453 381/23.1 |
| 2014/0363003 | A1 | 12/2014 | Kupershmidt et al. | | |
| 2014/0363033 | A1 * | 12/2014 | Heiman | ................... | H04R 1/46 381/151 |
| 2015/0036856 | A1 | 2/2015 | Pruthi et al. | | |

* cited by examiner

*Primary Examiner* — Hemant Patel
(74) *Attorney, Agent, or Firm* — McDonnell Boehnen Hulbert & Berghoff

(57) ABSTRACT

The present application describes signal enhancements to reduce bone conduction sensations of a wearable computing device and applications thereof. An example apparatus includes a wearable computing device comprising a bone conduction transducer (BCT) configured to receive and be driven by an audio signal, a processor, and a data storage comprising instructions executable by the processor to: (1) determine an input gain level of the audio signal at a frequency range; (2) compare the determined input gain level at the frequency range to a threshold gain level at the frequency range; (3) based on the comparison, apply a multi-band compressor (MBC) configured to process the audio signal to reduce gain in at least a portion of a mid-band frequency range of the audio signal; and (4) drive the BCT with the processed audio signal.

26 Claims, 8 Drawing Sheets

SIGNAL ENHANCEMENTS FOR AUDIO

BACKGROUND

Computing devices such as personal computers, laptop computers, tablet computers, cellular phones, and countless types of Internet-capable devices are increasingly prevalent in numerous aspects of modern life. As computers become more advanced, augmented-reality devices, which blend computer-generated information with the user's perception of the physical world, are expected to become more prevalent.

To provide an augmented-reality experience, location and context-aware computing devices may be worn by a wearer as they go about various aspects of their everyday life. Such computing devices, which are referred to as wearable computing devices, are configured to sense and analyze a wearer's environment and to provide information intelligently, as appropriate to the physical world being experienced by the wearer. A wearable computing device may drive a speaker of the wearable computing device with an audio signal, such that vibrations transfer to the wearer's bone structure. To drive a speaker of a wearable computing device while limiting bone conduction sensations or uncomfortable vibrations experienced by a wearer, a multi-band compressor (MBC) may be applied to modify the audio signal that drives the speaker of the wearable computing device.

SUMMARY

In order to transfer sound vibrations to a wearer's bone structure, a bone conduction transducer (BCT) is typically arranged on a wearable device so as to contact the wearer. When the BCT is driven to certain volume levels, the vibrations of the BCT can be uncomfortable for the wearer and may cause bone conduction sensations or tickling sensations. The wearer may limit the bone conduction sensations or tickling sensations by reducing the volume, but this may also be undesirable if the wearer wants to, for example, turn the volume up so that they are able to participate in a phone call in a noisy environment. Further, the inventors have determined that, in at least some arrangements, mid-band frequencies may be the cause of such tickling sensation when a BCT is in use. Accordingly, example embodiments may allow a BCT to achieve higher overall volume levels without causing a tickling sensation by utilizing a multi-band compressor (MBC) to process the mid-band of audio signals that drive a BCT.

In one aspect, an example method is disclosed that includes determining, via a wearable computing device, an input gain level of an audio signal at a frequency range. The method further includes comparing the determined input gain level at the frequency range to a threshold gain level at the frequency range. Based on the comparison, the method may apply a multi-band compressor (MBC) configured to process the audio signal to reduce gain in at least a portion of a mid-band frequency range of the audio signal. Additionally, the method may drive a bone conduction transducer (BCT) with the processed audio signal.

In yet another aspect, a non-transitory computer-readable medium is disclosed having stored therein instructions executable by a computing device to cause the computing device to perform the example method described above.

In still another aspect, a wearable computing device is disclosed that comprises: a BCT configured to receive and be driven by an audio signal, a processor, and a data storage comprising instructions executable by the processor to: (1) determine an input gain level of the audio signal at a frequency range; (2) compare the determined input gain level at the frequency range to a threshold gain level at the frequency range; (3) based on the comparison, apply an MBC configured to process the audio signal to reduce gain in at least a portion of a mid-band frequency range of the audio signal; and (4) drive the BCT with the processed audio signal.

These as well as other aspects, advantages, and alternatives, will become apparent to those of ordinary skill in the art by reading the following detailed description, with reference where appropriate to the accompanying drawings.

DETAILED DESCRIPTION

Figure 1A:
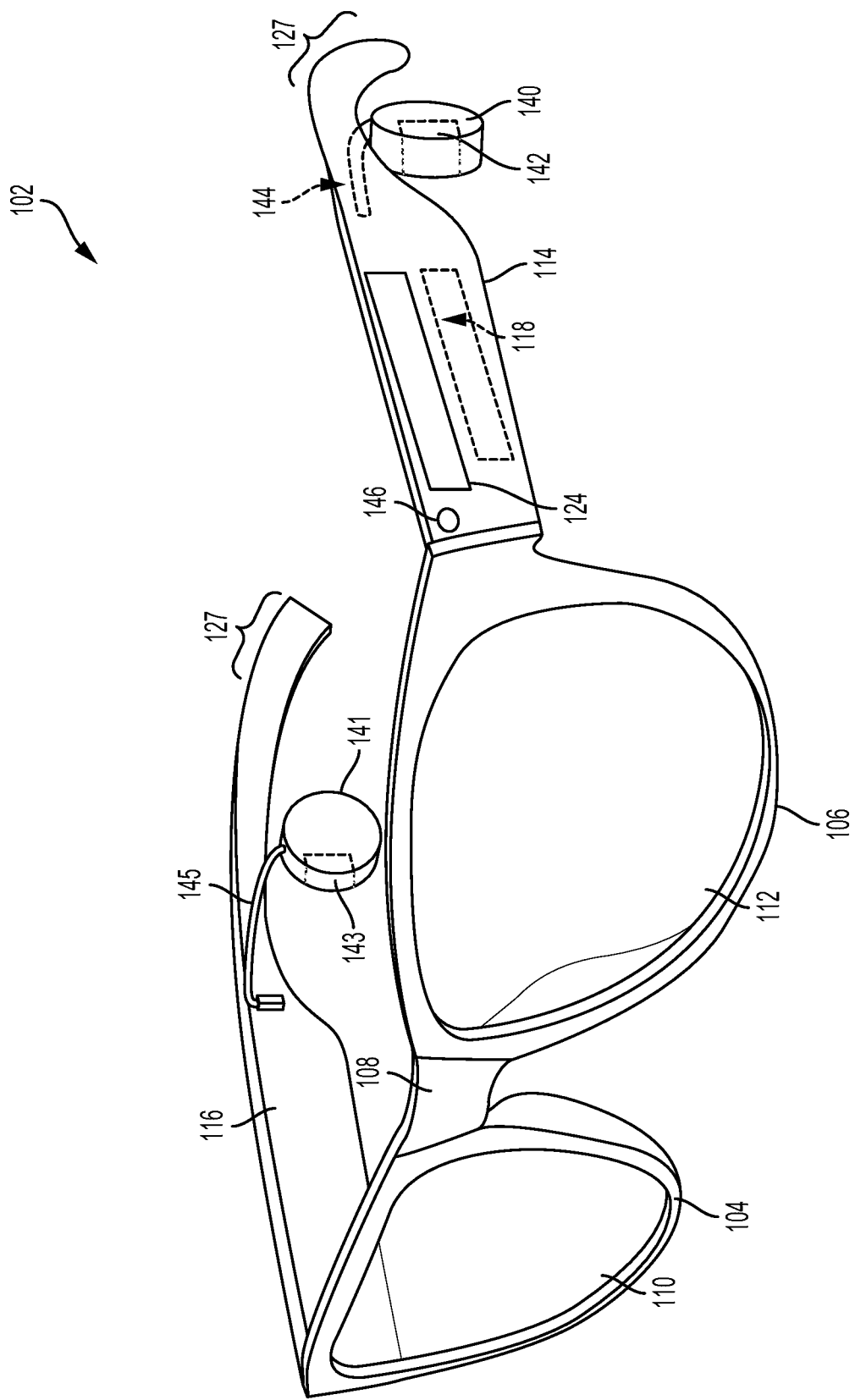
FIG. 1A and FIG. 1B illustrate wearable computing devices in the form of glasses-style wearable devices, in accordance with example embodiments.

The following detailed description describes various features and functions of the disclosed systems and methods with reference to the accompanying figures. In the figures, similar symbols typically identify similar components, unless context dictates otherwise. The illustrative system and method embodiments described herein are not meant to be limiting. It will be readily understood that certain aspects of the disclosed systems and methods can be arranged and combined in a wide variety of different configurations, all of which are contemplated herein.

1. Overview

A wearable computing device may be configured to execute any number of functions, such as displaying information on a display of the wearable computing device, communicating with one or more other devices, emitting audio, visual, and/or haptic notifications, receiving inputs, and sensing an environment around the wearable computing device.

A wearable computing device may include a bone conduction transducer (BCT) to transfer vibrations to a wearer's bone structure in order to emit audio to the wearer. In any such wearable computing device, a BCT may be arranged on the wearable computing device so as to contact the back of the wearer's ear.

For instance, the BCT may be located on a hook-like section of a wearable computing device, which extends behind a wearer's ear and helps to keep the device in place. In such an arrangement, the BCT may be located on the device such that the BCT contacts the back of the wearer's ear (e.g., at the auricle) when the device is worn. Note that in such an arrangement and possibly other arrangements as well, the BCT may vibrate the wearer's cartilage and/or bone structure. Vibrating the wearer's cartilage may transfer sound to the inner ear. The placement of the BCT against the back of a wearer's ear may be more discrete because it may hide much of the device from view. As a result, such an arrangement may be considered more socially acceptable and/or more aesthetically desirable. Further, a behind-ear arrangement of a BCT may provide for higher sound quality/fidelity. Additionally or alternatively, the BCT may include a flexible pad that contacts the back of the wearer's ear or is arranged such that the flexible pad helps transfer vibrations from the BCT to the wearer's bone structure.

When the BCT is driven to certain volume levels, the vibrations from the BCT to the wearer's bone structure can be uncomfortable for the wearer and may cause bone conduction sensations or tickling sensations. The wearer may limit the bone conduction sensations or tickling sensations by reducing the volume, but this may also be undesirable if the wearer wants to, for example, turn the volume up so that they are able to participate in a phone call in a noisy environment. Accordingly, example embodiments may limit the bone conduction sensations or tickling sensations while maintaining a desired volume level by integrating a multi-band compressor (MBC) with the BCT of a wearable computing device.

In existing MBC applications, such as an MBC implemented in a signal processor for loudspeakers or headphones, the MBC is applied to a low frequency band. For example, an MBC may be applied to an audio signal driving loudspeakers or headphones to reduce the distortion produced by bass (i.e., low frequencies) at higher volumes. However, for a wearable computing device comprising a BCT, an MBC may be integrated at a mid-band frequency range to limit tickling sensations or uncomfortable vibrations that occur when the BCT is driven to certain volume levels.

Generally, an MBC divides the frequency spectrum into different frequency bands or sections, such that each frequency band or section has its own unique compression settings. For example, an MBC may divide the frequency spectrum into a low-band, a mid-band, and a high-band. For a wearable computing device, the low-band, for example, may be in a frequency range below 800 Hz, the mid-band may be a frequency range from 800 Hz to 2000 Hz, and the high-band may be in a frequency range above 2000 Hz. For each frequency band or section, an MBC may be configured to process an audio signal and dynamically modify the gain of an audio signal at each frequency band or section.

For example, a wearable computing device may apply an MBC configured to process an audio signal to reduce gain in at least a portion of a mid-band frequency range of the audio signal, and drive a BCT with the processed audio signal to limit tickling sensations or uncomfortable vibrations experienced at a mid-band frequency. In determining whether to apply an MBC to modify the gain of an audio signal, the wearable computing device may be configured to compare an input gain level of the audio signal at a frequency band to a threshold gain level for that frequency band. The threshold gain level for each frequency band may be determined by tuning each frequency band of the MBC. For example, the mid-band frequency range of 800 Hz to 2000 Hz may be tuned to find an appropriate gain level at the mid-band frequency range where the tickling sensations or uncomfortable vibrations experienced by a wearer are limited. A frequency range below 800 Hz and a frequency range above 2000 Hz may be tuned as well.

2. Illustrative Wearable Devices

Systems and devices in which exemplary embodiments may be implemented will now be described in greater detail. However, an exemplary system may also be implemented in or take the form of other devices, without departing from the scope of the invention.

An illustrative wearable device may include an ear-piece with a bone-conduction speaker (e.g., a bone conduction transducer or "BCT"). A BCT may be operable to vibrate the wearer's bone structure at a location where the vibrations travel through the wearer's bone structure to the middle ear, such that the brain interprets the vibrations as sounds. The wearable device may take the form of an earpiece with a BCT, which can be tethered via a wired or wireless interface to a user's phone, or may be a standalone earpiece device with a BCT. Alternatively, the wearable device may be a glasses-style wearable device that includes one or more BCTs and has a form factor that is similar to traditional eyeglasses.

FIG. 1A illustrates a wearable computing device 102, according to an exemplary embodiment. In FIG. 1A, the wearable computing device 102 takes the form of glasses-style wearable computing device. Note that wearable computing device 102 may also be considered an example of a head-mountable device (HMD), and thus may also be referred to as an HMD 102. It should be understood, however, that exemplary systems and devices may take the form of or be implemented within or in association with other types of devices, without departing from the scope of the invention. As illustrated in FIG. 1A, the wearable computing device 102 comprises frame elements including lens-frames 104, 106 and a center frame support 108, lens elements 110, 112, and extending side-arms 114, 116. The center frame support 108 and the extending side-arms 114, 116 are configured to secure the wearable computing device 102 to a user's head via placement on a user's nose and ears, respectively.

Each of the frame elements 104, 106, and 108 and the extending side-arms 114, 116 may be formed of a solid structure of plastic and/or metal, or may be formed of a hollow structure of similar material so as to allow wiring and component interconnects to be internally routed through HMD 102. Other materials are possible as well. Each of the lens elements 110, 112 may also be sufficiently transparent to allow a user to see through the lens element.

The extending side-arms 114, 116 may each be projections that extend away from the lens-frames 104, 106, respectively, and may be positioned behind a user's ears to secure the HMD 102 to the user's head. The extending side-arms 114, 116 may further secure the HMD 102 to the user by extending around a rear portion of the user's head. Additionally or alternatively, for example, the HMD 102 may connect to or be affixed within a head-mountable helmet structure. Other possibilities exist as well.

In a further aspect, an HMD 102 may include various types of sensors and/or sensory components. For instance, HMD 102 could include an inertial measurement unit (IMU) (not explicitly shown in FIG. 1A), which provides an accelerometer, gyroscope, and/or magnetometer. In some embodiments, an HMD 102 could also include an accelerometer, a gyroscope, and/or a magnetometer that is not integrated in an IMU.

In a further aspect, HMD 102 may include sensors that facilitate a determination as to whether or not the HMD 102 is being worn. For instance, sensors such as an accelerometer, gyroscope, and/or magnetometer could be used to detect motion that is characteristic of the HMD being worn (e.g., motion that is characteristic of user walking about, turning their head, and so on), and/or used to determine that the HMD is in an orientation that is characteristic of the HMD being worn (e.g., upright, in a position that is typical when the HMD is worn over the ear). Accordingly, data from such sensors could be used as input to an on-head detection process. Additionally or alternatively, HMD 102 may include a capacitive sensor or another type of sensor that is arranged on a surface of the HMD 102 that typically contacts the wearer when the HMD 102 is worn. Accordingly data provided by such a sensor may be used to determine whether or not the HMD is being worn. Other sensors and/or other techniques may also be used to detect when the HMD is being worn.

In a further aspect, earpiece 140 and 141 are attached to side-arms 114 and 116, respectively. Earpieces 140 and 141 can each include a BCT 142 and 143, respectively. Each earpiece 140, 141 may be arranged such that when the HMD 102 is worn, each BCT 142, 143 is positioned to the posterior of a wearer's ear. For instance, in an exemplary embodiment, an earpiece 140, 141 may be arranged such that a respective BCT 142, 143 can contact the auricle of both of the wearer's ear. Other arrangements of earpieces 140, 141 are also possible. Further, embodiments with a single earpiece 140 or 141 are also possible.

In an exemplary embodiment, a BCT, such as BCT 142 and/or BCT 143, may operate as a bone-conduction speaker. For instance, a BCT may be implemented with a vibration transducer that is configured to receive an audio signal and to vibrate a wearer's bone structure in accordance with the audio signal. More generally, it should be understood that any component that is arranged to vibrate a wearer's bone structure may be incorporated as a bone-conduction speaker, without departing from the scope of the invention.

In a further aspect, HMD 102 may include at least one audio source (not shown) that is configured to provide an audio signal that drives BCT 142 and/or BCT 143. For instance, in an exemplary embodiment, an HMD 102 may include an internal audio playback device such as an on-board computing system 118 that is configured to play digital audio files. Additionally or alternatively, an HMD 102 may include an audio interface to an auxiliary audio playback device (not shown), such as a portable digital audio player, a smartphone, a home stereo, a car stereo, and/or a personal computer, among other possibilities. In some embodiments, an application or software-based interface may allow for the HMD 102 to receive an audio signal that is streamed from another computing device, such as the user's mobile phone. An interface to an auxiliary audio playback device could additionally or alternatively be a tip, ring, sleeve (TRS) connector, or may take another form. Other audio sources and/or audio interfaces are also possible.

Further, in an embodiment with two ear-pieces 140 and 141, which both include BCTs, the ear-pieces 140 and 141 may be configured to provide stereo audio. However, non-stereo audio is also possible in devices that include two ear-pieces.

The HMD 102 may also include an on-board computing system 118 and at least one finger-operable touch pad 124. The on-board computing system 118 is shown to be integrated in side-arm 114 of HMD 102. However, an on-board computing system 118 may be provided on or within other parts of the head-mounted device 102 or may be positioned remotely from and communicatively coupled to a head-mountable component of a computing device (e.g., the on-board computing system 118 could be housed in a separate component that is not head wearable, and is wired or wirelessly connected to a component that is head wearable). The on-board computing system 118 may include a processor and memory, for example. Further, the on-board computing system 118 may be configured to receive and analyze data from a finger-operable touch pad 124 (and possibly from other sensory devices and/or user interface components).

Additionally, an MBC (not explicitly shown in FIG. 1A) may be implemented as a software module or application that is executable by the on-board computing system 118 to process an audio signal received via HMD 102, and modify the audio signal to limit tickling sensations or uncomfortable vibrations experienced by a wearer when BCT 142 and/or BCT 143 is driven to certain volume levels. Alternatively, the MBC may be implemented on a separate chipset, such as a sound card, which includes its own memory, processor(s), and input/output interfaces, among other components. Other implementations of an MBC are also possible.

The MBC may divide the frequency spectrum into a low-band, a mid-band, and a high-band (each being a "frequency band"). More specifically, for HMD 102, the mid-band may be a frequency range from 800 Hz to 2000 Hz, while the low-band and high-band may be in a frequency range below 800 Hz or above 2000 Hz, respectively. However, the MBC may divide the frequency spectrum into more or less than three frequency bands. Further, the frequency range and/or shape of attenuation of each frequency band may vary based on the shape or material used to form BCT 142 and/or BCT 143 of HMD 102.

The on-board computing system 118 may execute the MBC to dynamically modify the gain of the audio signal received at each frequency band or section. For example, HMD 102 may apply the MBC to process the audio signal and reduce gain in at least a portion of a mid-band frequency range of the audio signal. After applying the MBC, HMD 102 may drive BCT 142 and/or BCT 143 with the processed audio signal to limit uncomfortable vibrations experienced at a mid-band frequency.

In determining whether to apply an MBC to modify the gain of an audio signal, on-board computing system 118 may be configured to compare an input gain level of the audio signal at a frequency band received via HMD 102 to a threshold gain level for that frequency band. The threshold gain level for each frequency band may be determined by tuning each frequency band. For example, the mid-band frequency range of 800 Hz to 2000 Hz may be tuned to find the appropriate gain level at the mid-band where the tickling sensations or uncomfortable vibrations experienced by the wearer are limited. If the input gain level of the audio signal at the mid-band is greater than the threshold gain level for the mid-band, HMD 102 may apply an MBC to process and reduce gain of the audio signal at the mid-band and drive BCT 142 and/or BCT 143 with the processed audio signal.

Additionally, a frequency range below 800 Hz and a frequency range above 2000 Hz may be tuned to find the threshold gain level for the low-band and high-band, respectively. If, for example, the input gain level of the audio signal at a low-band is greater than the threshold gain level for the low-band, HMD 102 may apply an MBC to process and reduce gain of the audio signal and drive BCT 142 and/or BCT 143 with the processed audio signal. On the other hand, if the input gain level of the audio signal at the low-band is less than the threshold gain level for the low-band, HMD 102 may apply an MBC to process and increase gain of the audio signal and drive BCT 142 and/or BCT 143 with the processed audio signal. Alternatively, HMD 102 may drive BCT 142 and/or BCT 143 without applying an MBC to the audio signal received. HMD 102 may be further configured to compare an input gain level of an audio signal at a high-band, and apply an MBC to process and modify gain of the audio signal similar to the way gain of the audio signal in the low-band is processed and modified.

In a further aspect, touch pad 124 is shown as being arranged on side-arm 114 of the HMD 102. However, the finger-operable touch pad 124 may be positioned on other parts of the HMD 102. Also, more than one touch pad may be present on the head-mounted device 102. For example, a second touchpad may be arranged on side-arm 116. Additionally or alternatively, a touch pad may be arranged on a rear portion 127 of one or both side-arms 114 and 116. In such an arrangement, the touch pad may arranged on an upper surface of the portion of the side-arm that curves around behind a wearer's ear (e.g., such that the touch pad is on a surface that generally faces towards the rear of the wearer, and is arranged on the surface opposing the surface that contacts the back of the wearer's ear). Other arrangements of one or more touch pads are also possible.

The touch pad 124 may sense the touch and/or movement of a user's finger on the touch pad via capacitive sensing, resistance sensing, or a surface acoustic wave process, among other possibilities. In some embodiments, touch pad 124 may be a one-dimensional or linear touchpad, which is capable of sensing touch at various points on the touch surface, and of sensing linear movement of a finger on the touch pad (e.g., movement forward or backward along the side-arm 124). In other embodiments, touch pad 124 may be a two-dimensional touch pad that is capable of sensing touch in any direction on the touch surface. Additionally, in some embodiments, touch pad 124 may be configured for near-touch sensing, such that the touch pad can sense when a user's finger is near to, but not in contact with, the touch pad. Further, in some embodiments, touch pad 124 may be capable of sensing a level of pressure applied to the pad surface. HMD 102 also includes at least one microphone 146, which may allow the HMD 102 to receive voice commands from a wearer. For example, HMD 102 may receive a voice command (i.e. "that tickles") indicating that a wearer is experiencing tickling sensations or uncomfortable vibrations from BCT142 and/or BCT 143 being driven at certain volume levels. The microphone 146 may be a directional microphone or an omni-directional microphone. Further, in some embodiments, an HMD 102 may include a microphone array and/or multiple microphones arranges at various locations on the HMD.

Figure 1B:
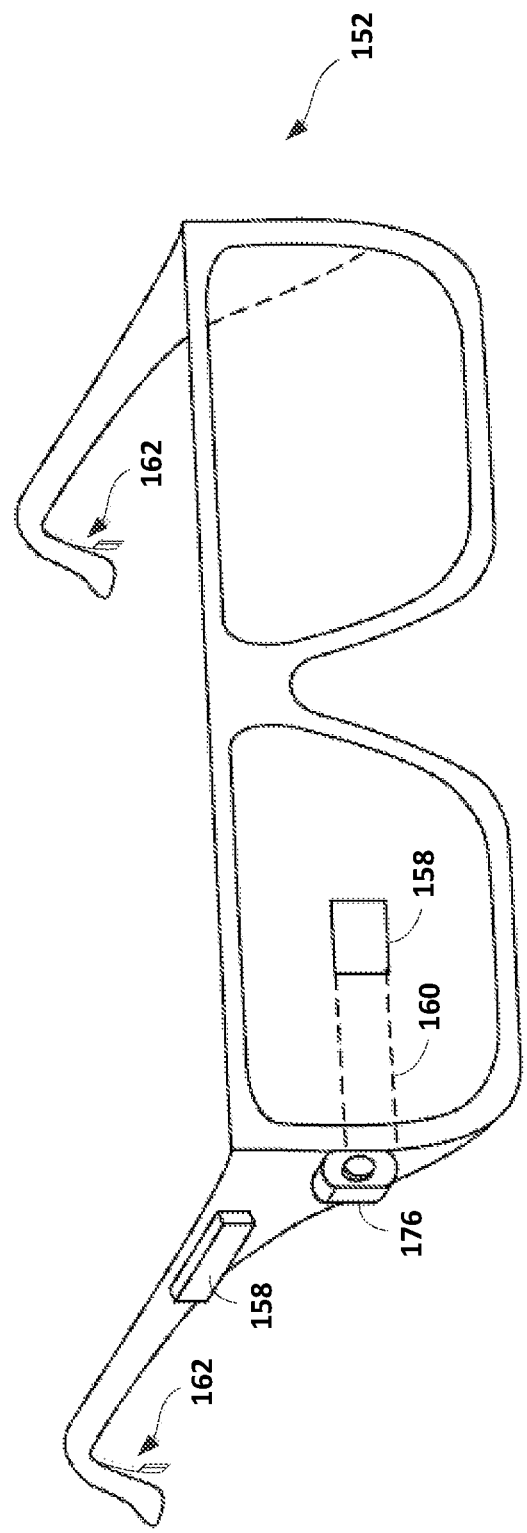

Note that in the example shown in FIG. 1A, HMD 102 does not include a graphical display. FIG. 1B shows another wearable computing device 152 according to an example embodiment, which is similar to the HMD shown in FIG. 1B but includes a graphical display. In particular, the wearable computing device shown in FIG. 1B takes the form of a glasses-style HMD 152 with a near-eye display 158. As shown, HMD 152 may include BCTs 162 that is configured and functions similarly to BCTs 142 and 143, an onboard computing system 158 that is configured and functions similarly to onboard computing system 118, and a microphone 176 that is configured and functions similarly to microphone 146. HMD 152 may additionally or alternatively include other components, which are not shown in FIG. 1B.

HMD 152 includes a single graphical display 158, which may be coupled to the on-board computing system 158, to a standalone graphical processing system, and/or to other components of HMD 152. The display 158 may be formed on one of the lens elements of the HMD 152, such as a lens element described with respect to FIG. 1A, and may be configured to overlay computer-generated graphics in the wearer's field of view, while also allowing the user to see through the lens element and concurrently view at least some of their real-world environment. (Note that in other embodiments, a virtual reality display that substantially obscures the user's view of the physical world around them is also possible.) The display 158 is shown to be provided in a center of a lens of the HMD 152, however, the display 158 may be provided in other positions, and may also vary in size and shape. The display 158 may be controllable via the computing system 154 that is coupled to the display 158 via an optical waveguide 160.

Other types of near-eye displays are also possible. For example, a glasses-style HMD may include one or more projectors (not shown) that are configured to project graphics onto a display on an inside surface of one or both of the lens elements of HMD. In such a configuration, the lens element(s) of the HMD may act as a combiner in a light projection system and may include a coating that reflects the light projected onto them from the projectors, towards the eye or eyes of the wearer. In other embodiments, a reflective coating may not be used (e.g., when the one or more projectors take the form of one or more scanning laser devices).

As another example of a near-eye display, one or both lens elements of a glasses-style HMD could include a transparent or semi-transparent matrix display, such as an electroluminescent display or a liquid crystal display, one or more waveguides for delivering an image to the user's eyes, or other optical elements capable of delivering an in focus near-to-eye image to the user. A corresponding display driver may be disposed within the frame of the HMD for driving such a matrix display. Alternatively or additionally, a laser or LED source and scanning system could be used to draw a raster display directly onto the retina of one or more of the user's eyes. Other types of near-eye displays are also possible.

Generally, it should be understood that an HMD and other types of wearable devices may include other types of sensors and components, in addition or in the alternative to those described herein. Further, variations on the arrangements of sensory systems and components of an HMD described herein, and different arrangements altogether, are also possible.

Figure 2A:
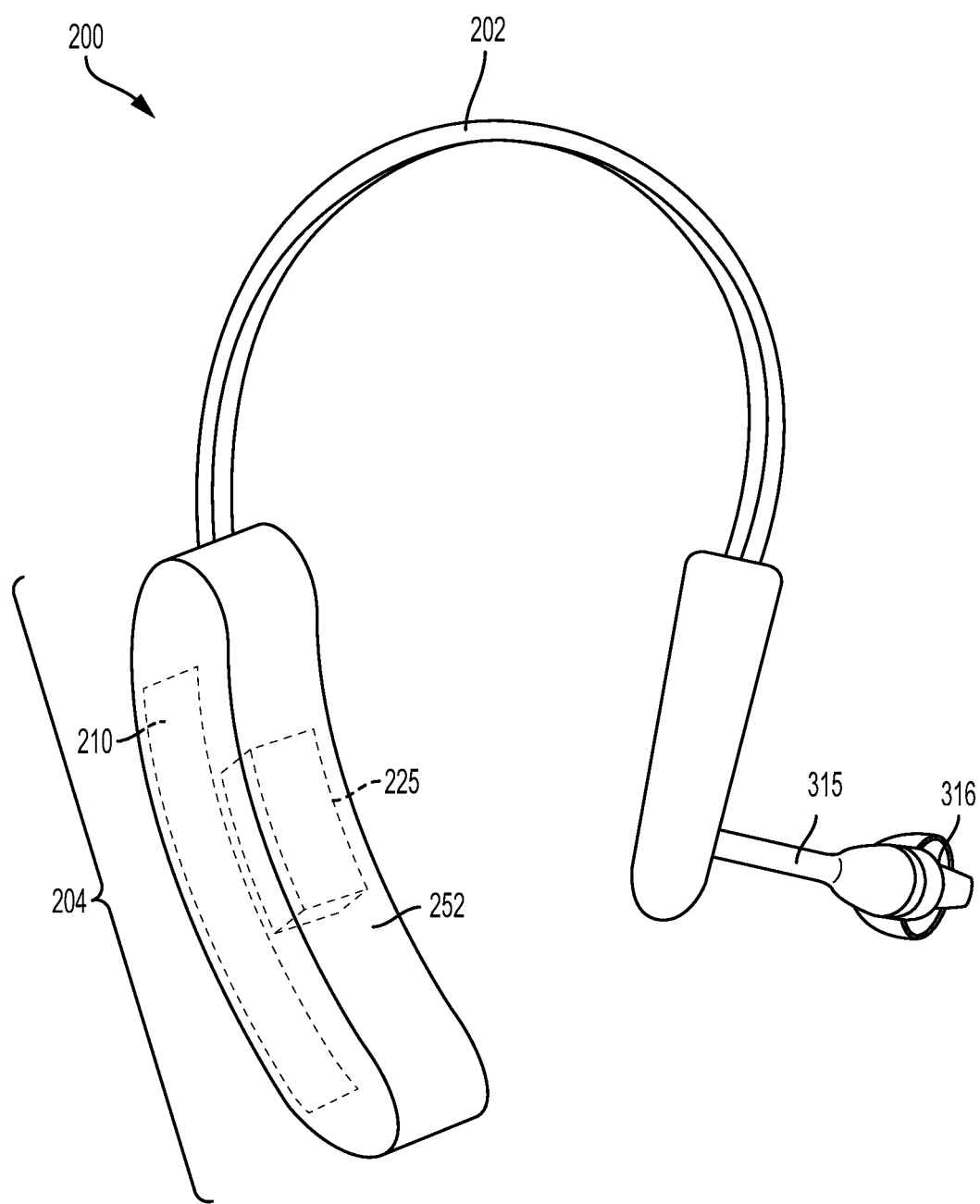
FIG. 2A, FIG. 2B, and FIG. 2C illustrate wearable computing devices in the form of earpiece devices, in accordance with example embodiments.
Figure 2C:
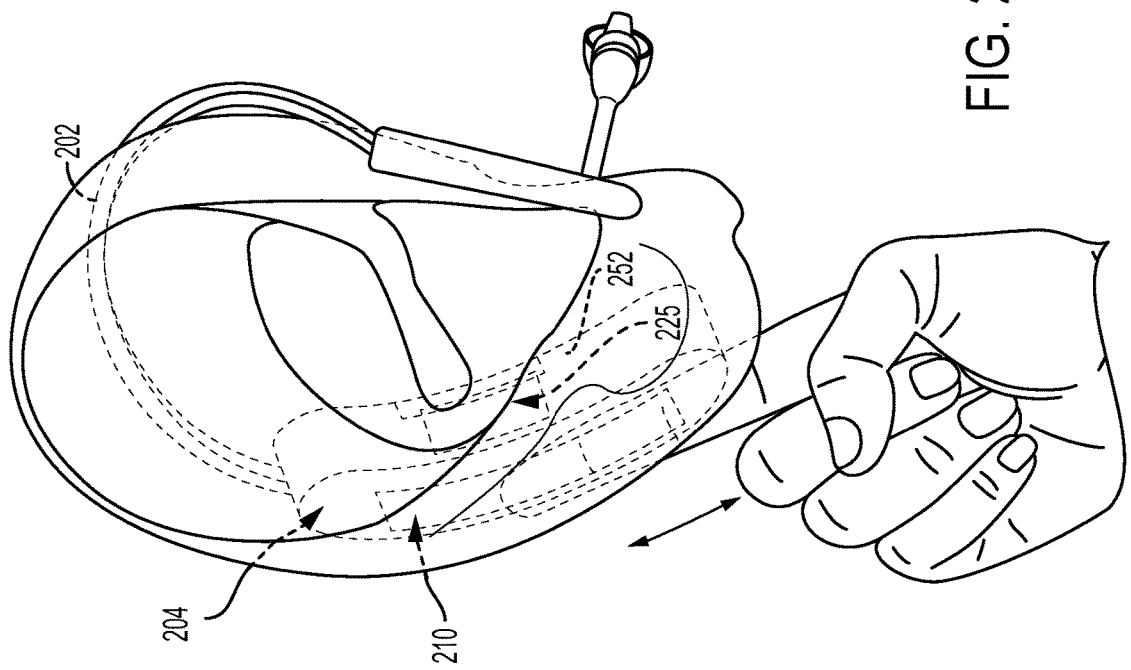
Figure 2B:
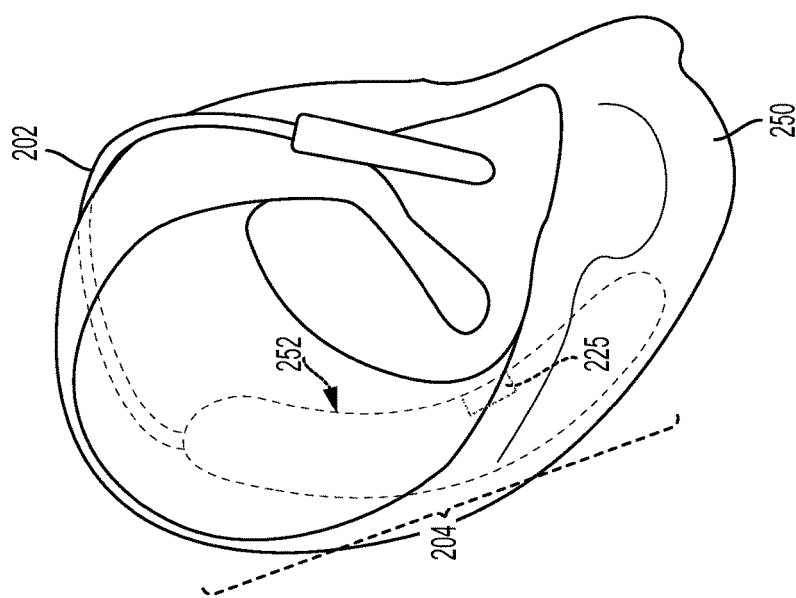

FIGS. 2A, 2B, and 2C show another wearable computing device according to an example embodiment. More specifically, FIG. 2A to 2C show an earpiece device 200, which includes an earpiece frame 202 and a behind-ear housing 204. As shown in FIG. 2B, the earpiece frame 202 is curved, and is shaped so as to hook over a wearer's ear 250. When hooked over the wearer's ear 250, the behind-ear housing 204 is located behind the wearer's ear. For example, in the illustrated configuration, the behind-ear housing 204 is located behind the auricle, such that a surface 252 of the behind-ear housing 204 contacts the wearer on the back of the auricle.

Note that the behind-ear housing 204 may be partially or completely hidden from view, when the wearer of earpiece device 200 is viewed from the side. As such, an earpiece device 200 may be worn more discretely than other bulkier and/or more visible wearable computing devices.

Referring back to FIG. 2A, the behind-ear housing 204 may include a BCT 225, and touch pad 210. BCT 225 may be, for example, a vibration transducer or an electro-acoustic transducer that produces sound in response to an electrical audio signal input. As such, BCT 225 may function as a bone-conduction speaker that plays audio to the wearer by vibrating the wearer's bone structure. Other types of BCTs are also possible. Generally, a BCT may be any structure that is operable to directly or indirectly vibrate the bone structure of the user.

As shown in FIG. 2C, the BCT 225, may be arranged on or within the behind-ear housing 204 such that when the earpiece device 200 is worn, BCT 225 is positioned posterior to the wearer's ear, in order to vibrate the wearer's bone structure. More specifically, BCT 225 may form at least part of, or may be vibrationally coupled to the material that forms, surface 252 of behind-ear housing 204. Further, earpiece device 200 may be configured such that when the device is worn, surface 252 is pressed against or contacts the back of the wearer's ear. As such, BCT 225 may transfer vibrations to the wearer's bone structure via surface 252. Other arrangements of a BCT on an earpiece device are also possible.

In a further aspect, similar to the MBC for HMD 102 in FIG. 1A, earpiece device 200 may be integrated with an MBC (not explicitly shown) that processes and dynamically modifies the gain of an audio signal received via earpiece device 200 for each frequency band.

As shown in FIG. 2C, the touch pad 210 may arranged on a surface of the behind-ear housing 204 that curves around behind a wearer's ear (e.g., such that the touch pad is generally faces towards the wearer's posterior when the earpiece device is worn). Other arrangements are also possible.

In some embodiments, touch pad 210 may be a one-dimensional or linear touchpad, which is capable of sensing touch at various points on the touch surface, and of sensing linear movement of a finger on the touch pad (e.g., movement upward or downward on the back of the behind-ear housing 204). In other embodiments, touch pad 210 may be a two-dimensional touch pad that is capable of sensing touch in any direction on the touch surface. Additionally, in some embodiments, touch pad 210 may be configured for near-touch sensing, such that the touch pad can sense when a user's finger is near to, but not in contact with, the touch pad. Further, in some embodiments, touch pad 210 may be capable of sensing a level of pressure applied to the pad surface.

In the illustrated embodiment, earpiece device 200 also includes a microphone arm 215, which may extend towards a wearer's mouth, as shown in FIG. 2B. Microphone arm 215 may include a microphone 216 that is distal from the earpiece. Microphone 216 may be an omni-directional microphone or a directional microphone. Further, an array of microphones could be implemented on microphone arm 215. Alternatively, a bone conduction microphone (BCM), could be implemented on a microphone arm 215. In such an embodiment, the arm 215 may be operable to locate and/or press a BCM against the wearer's face near or on the wearer's jaw, such that the BCM vibrates in response to vibrations of the wearer's jaw that occur when they speak. Note that the microphone arm 215 is optional, and other configurations for a microphone are also possible. Further, in some embodiments, arm 215 may be a removable component, which can be attached and detached from the earpiece device by the user.

In some embodiments, a wearable device may include two types of microphones: one or more microphones arranged specifically to detect speech by the wearer of the device, and one or more microphones that are arranged to detect sounds in the wearer's environment (perhaps in addition to the wearer's voice). Such an arrangement may facilitate intelligent processing based on whether or not audio includes the wearer's speech. Additionally, a wearable device may receive a voice command (i.e. "that tickles") indicating that a wearer is experiencing tickling sensations or uncomfortable vibrations.

In some embodiments, a wearable device may include an ear bud (not shown), which may function as a typical speaker and vibrate the surrounding air to project sound from the speaker. Thus, when inserted in the wearer's ear, the wearer may hear sounds in a discrete manner. Such an ear bud is optional, and may be implemented a removable (e.g., modular) component, which can be attached and detached from the earpiece device by the wearer.

3. Illustrative Computing Devices

Figure 3:
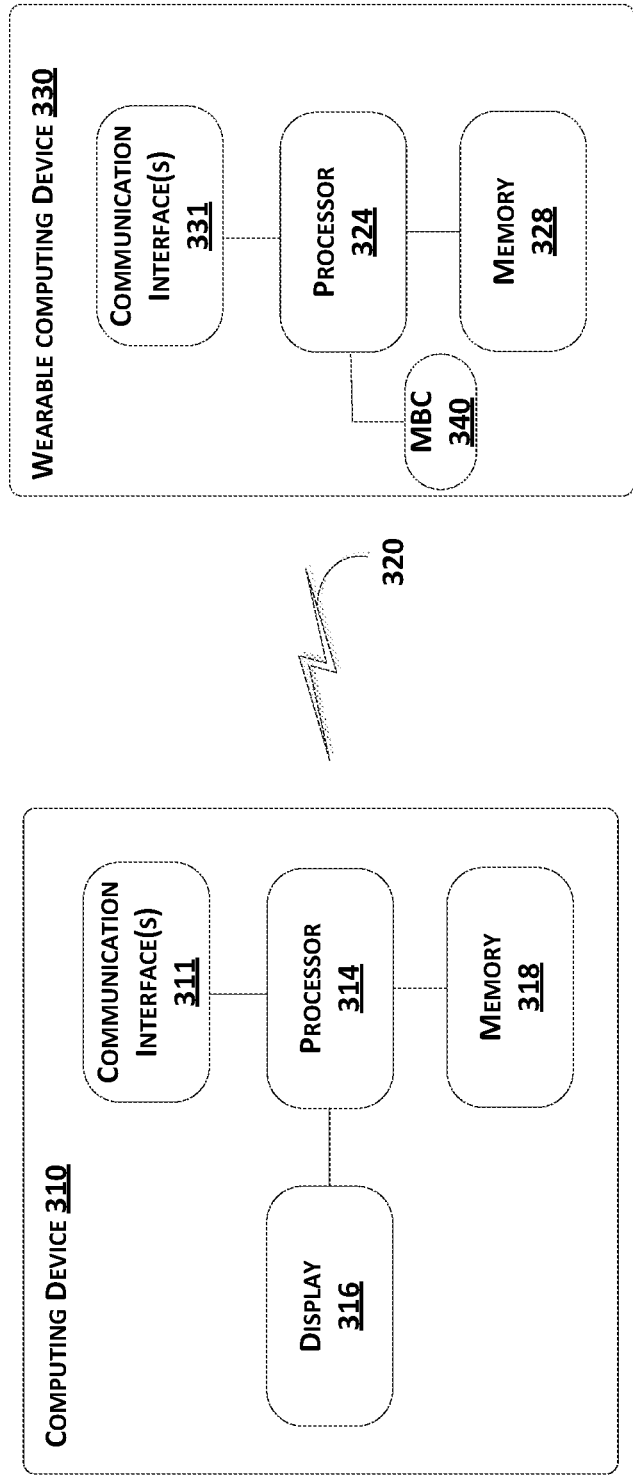
FIG. 3 is a block diagram showing components of a computing device and a wearable computing device, according to an example embodiment.

FIG. 3 is a block diagram showing basic components of a computing device 310 and a wearable computing device 330, according to an example embodiment. In an example configuration, computing device 310 and wearable computing device 330 are operable to communicate via a communication link 320 (e.g., a wired or wireless connection). Computing device 310 may be any type of device that can receive data and display information corresponding to or associated with the data. For example, the computing device 310 may be a mobile phone, a tablet computer, a laptop computer, a desktop computer, or an in-car computer, among other possibilities. Wearable computing device 330 may be a wearable computing device such as those described in reference to FIGS. 1A, 1B, 2A, 2B, and 2C, a variation on these wearable computing devices, or another type of wearable computing device altogether.

The wearable computing device 330 and computing device 310 include hardware and/or software to enable communication with one another via the communication link 320, such as processors, transmitters, receivers, antennas, etc. In the illustrated example, computing device 310 includes one or more communication interfaces 311, and wearable computing device 330 includes one or more communication interfaces 331. As such, the wearable computing device 330 may be tethered to the computing device 310 via a wired or wireless connection. Note that such a wired or wireless connection between computing device 310 and wearable computing device 330 may be established directly (e.g., via Bluetooth), or indirectly (e.g., via the Internet or a private data network).

In a further aspect, note that while computing device 310 includes a graphic display system 316, the wearable computing device 330 does not include a graphic display. In such a configuration, wearable computing device 330 may be configured as a wearable audio device, which allows for advanced voice control and interaction with applications running on another computing device 310 to which it is tethered.

As noted, communication link 320 may be a wired link, such as a universal serial bus or a parallel bus, or an Ethernet connection via an Ethernet port. A wired link may also be established using a proprietary wired communication protocol and/or using proprietary types of communication interfaces. The communication link 320 may also be a wireless connection using, e.g., Bluetooth® radio technology, communication protocols described in IEEE 802.11 (including any IEEE 802.11 revisions), Cellular technology (such as GSM, CDMA, UMTS, EV-DO, WiMAX, or LTE), or Zigbee® technology, among other possibilities.

As noted above, to communicate via communication link 320, computing device 310 and wearable computing device 330 may each include one or more communication interface (s) 311 and 331 respectively. The type or types of communication interface(s) included may vary according to the type of communication link 320 that is utilized for communications between the computing device 310 and the wearable computing device 330. As such, communication interface(s) 311 and 331 may include hardware and/or software that facilitates wired communication using various different wired communication protocols, and/or hardware and/or software that facilitates wireless communications using various different wired communication protocols.

Computing device 310 and wearable computing device 330 include respective processing systems 314 and 324. Processors 314 and 324 may be any type of processor, such as a micro-processor or a digital signal processor, for example. Note that computing device 310 and wearable computing device 330 may have different types of processors, or the same type of processor. Further, one or both of computing device 310 and a wearable computing device 330 may include multiple processors.

Computing device 310 and a wearable computing device 330 further include respective on-board data storage, such as memory 318 and memory 328. Processors 314 and 324 are communicatively coupled to memory 318 and memory 328, respectively. Memory 318 and/or memory 328 (any other data storage or memory described herein) may be computer-readable storage media, which can include volatile and/or non-volatile storage components, such as optical, magnetic, organic or other memory or disc storage. Such data storage can be separate from, or integrated in whole or in part with one or more processor(s) (e.g., in a chipset). In some implementations, the on-board data storage can be implemented using a single physical device (e.g., one optical, magnetic, organic or other memory or disc storage unit), while in other implementations, the on-board data storage can be implemented using two or more physical devices.

Memory 318 can store machine-readable program instructions that can be accessed and executed by the processor 314. Similarly, memory 328 can store machine-readable program instructions that can be accessed and executed by the processor 324.

In an exemplary embodiment, memory 328 may include program instructions stored on a non-transitory computer-readable medium and executable by the processor 324 to: (i) determine an input gain level of an audio signal received at a frequency band; (ii) compare the determined input gain level at the frequency band to a threshold gain level at the frequency band; (iii) based on the comparison, apply an MBC 340 configured to process the audio signal to reduce gain in at least a portion of a mid-band frequency range of the audio signal; and (iv) drive the BCT of a wearable computing device 330 with the processed audio signal.

MBC 340 may be implemented as a software module or application that is executable by the processor 324 to process an audio signal received via wearable computing device 330, and modify the audio signal to limit tickling sensations or uncomfortable vibrations experienced by a wearer when a BCT of wearable computing device 330 is driven to certain volume levels. Alternatively, an MBC may be implemented on a separate chipset, such as a sound card, which includes its own memory, processor(s), and input/output interfaces, among other components. Other implementations of an MBC are also possible.

In a further aspect, memory 318 may include program instructions stored on a non-transitory computer-readable medium and executable by the at least one processor to provide a graphical user-interface (GUI) on a graphic display 316.

In a further aspect, a communication interface 311 of the computing device 310 may be operable to receive a communication from the wearable audio device that is indicative of whether or not the wearable audio device is being worn. Such a communication may be based on sensor data generated by at least one sensor of the wearable audio device.

4. Illustrative Mbc Signal Enhancement

Figure 4:
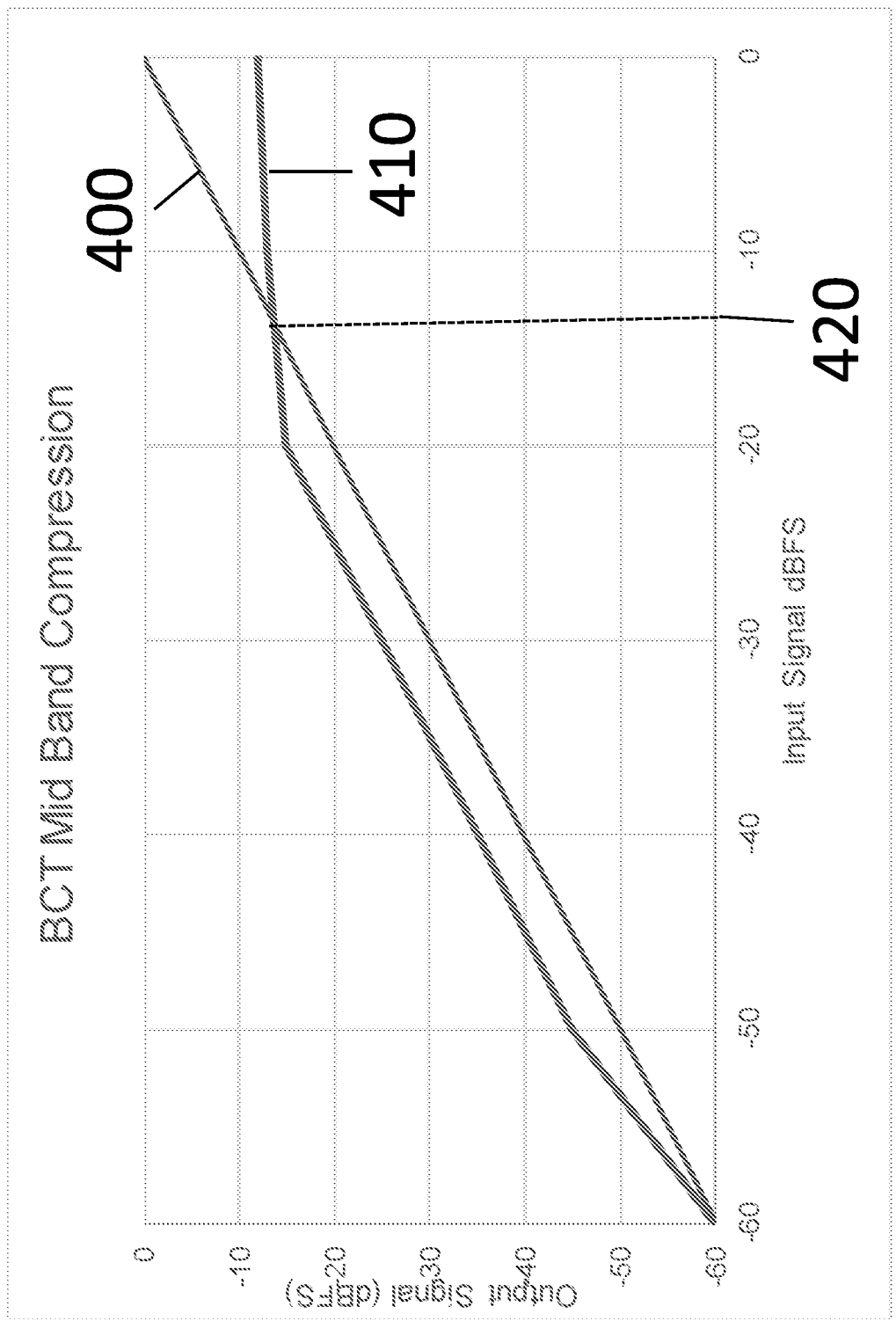
FIG. 4 illustrates system curves of a wearable computing device with and without an MBC integrated to the wearable computing device, in accordance with example embodiments.

FIG. 4 shows an example of a non-linear system curve 410 of a wearable computing device applying an MBC at a mid-band frequency range. The wearable computing device may be any of the wearable computing devices described herein or any wearable computing devices that are differently configured. The mid-band frequency range in FIG. 4 is from 800 Hz to 2000 Hz. For comparison, linear system curve 400 of a wearable computing device without an MBC is shown. As shown, the wearable computing device in linear system curve 400 receives an input audio signal at the mid-band, represented by the x-axis, and provides the input audio signal as the output audio signal to drive a BCT of a wearable computing device. On the other hand, the wearable computing device in non-linear system curve 410 receives an input audio signal at the mid-band, compares the input audio signal at the mid-band to a threshold gain level 420 at the mid-band, and applies an MBC to provide an appropriate output signal to drive a BCT of a wearable computing device.

In FIG. 4, the threshold gain level 420 at the mid-band is approximately −14 decibels relative to full scale (dBFS). The unit, dBFS, measures the decibel amplitude levels in digital systems which have a defined maximum available peak level (i.e. 0 dBFS is assigned to the maximum possible digital level). When a wearable computing device for non-linear system curve 410 receives an input audio signal gain of −10 dBFS at the mid-band, the wearable computing device compares the input audio signal gain to the threshold gain level 420 at the mid-band. Since the input audio signal gain of −10 dBFS exceeds the threshold gain level 420 at the mid-band, the wearable computing device for non-linear system curve 410 applies an MBC to process the input audio signal and reduce the input audio signal gain from −10 dBFS to −13 dBFS (i.e. a gain level that is 3 dB lower than the input signal) at the mid-band.

In contrast, the wearable computing device for non-linear system curve 410 applies an MBC to process the input audio signal at the mid-band and increase the input audio signal gain when the input audio signal gain does not exceed the threshold gain level 420 at the mid-band. For example, when the input audio signal gain is −30 dBFS, which is less than threshold gain level 420, the wearable computing device applies an MBC to increase the input audio signal gain to −25 dBFS (i.e. a gain level that is 5 dB greater than the input signal).

Figure 5:
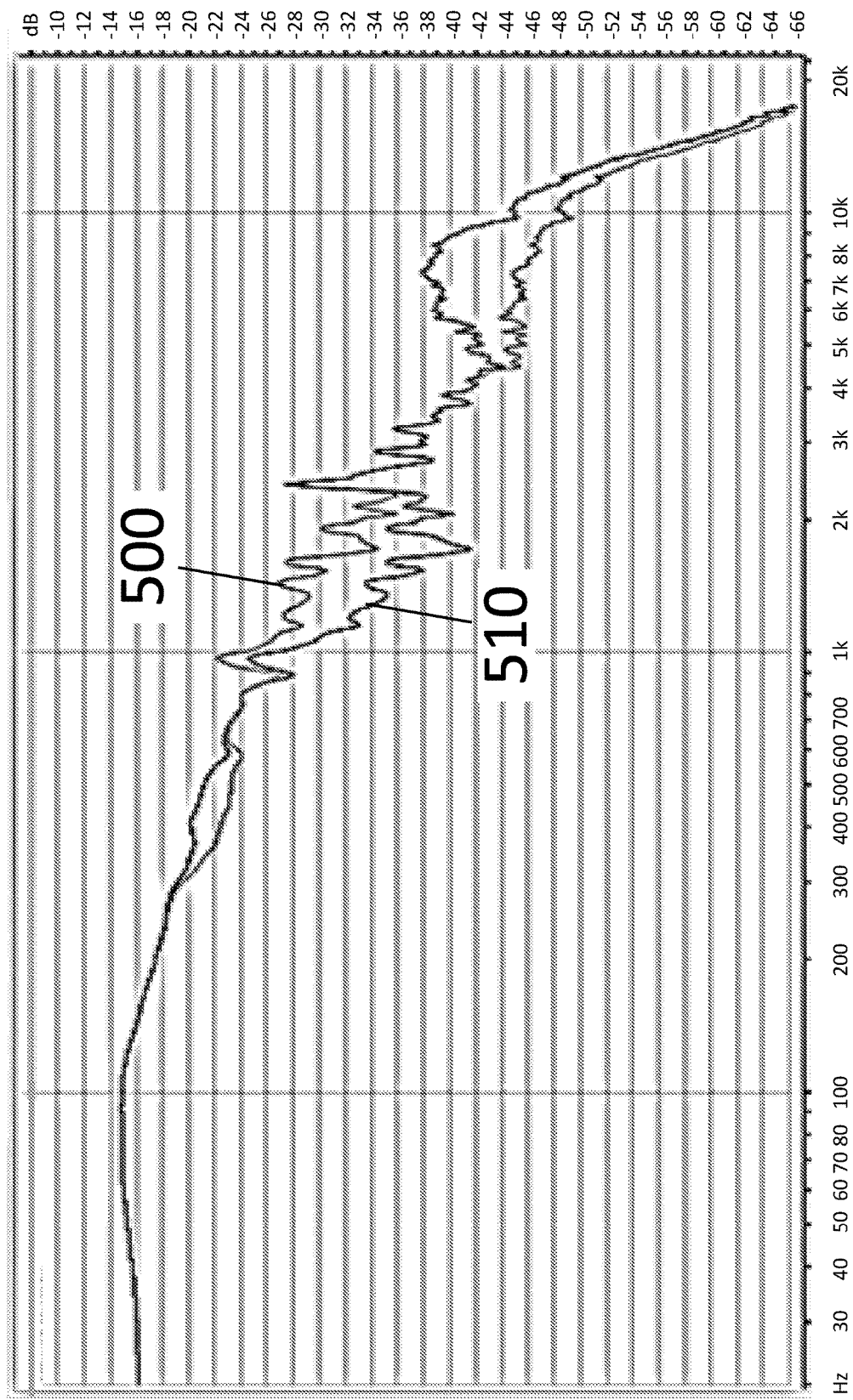
FIG. 5 illustrates system curves of a wearable computing device playing an audio file with and without an MBC integrated to the wearable computing device.

In yet another example, FIG. 5 shows a non-linear system curve 510 for a wearable computing device that applies an MBC to process and play an audio file across the entire frequency spectrum. In comparison, linear system curve 500 represents a wearable computing device playing the audio file without applying an MBC. As shown, the wearable computing device for linear system curve 500 receives an input audio signal from the audio file and provides an output audio signal to a BCT of a wearable computing device without applying an MBC. On the other hand, the wearable computing device for non-linear system curve 510 applies an MBC to modify the gain of the received input audio signal at each frequency band before providing an output signal to a BCT of a wearable computing device. For example, in the mid-band frequency range from 800 Hz to 2000 Hz, the wearable computing device for non-linear system curve 510 applies an MBC to reduce the input audio signal gain at the mid-band, and provide the reduced input audio signal gain as an output audio signal gain to a BCT of wearable computing device. In yet another example, for a frequency range above the mid-band frequency range (i.e. the high-band), the wearable computing device for non-linear system curve 510 applies an MBC at the high-band to increase the input audio signal gain and provide the increased signal gain as an output audio signal to a BCT of wearable computing device.

5. Example Method

Figure 6:
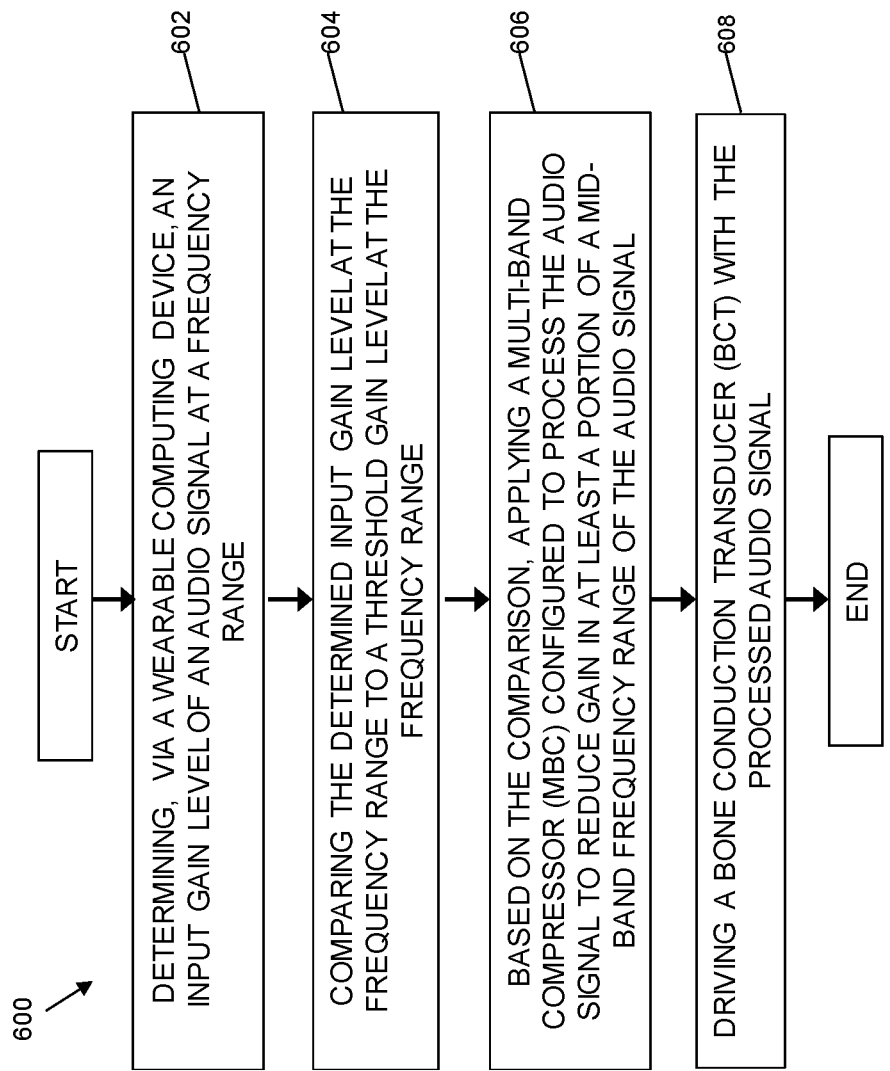
FIG. 6 is a flow chart illustrating a method, in accordance with an example embodiment.

FIG. 6 is a flowchart illustrating a method 600, in accordance with an example embodiment. Method 600 shown in FIG. 6 could be used with any of the wearable computing devices described herein or with wearable computing devices that are differently configured. Method 600 may include one or more operations, functions, or actions as illustrated by one or more of blocks 602-608. Although the blocks are illustrated in a sequential order, these blocks may also be performed in parallel, and/or in a different order than those described herein. Also, the various blocks may be combined into fewer blocks, divided into additional blocks, and/or removed based upon the desired implementation.

In addition, for the method 600 and other processes and methods disclosed herein, the flowchart shows functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer-readable medium, for example, such as a storage device including a disk or hard drive. The computer-readable medium may include a non-transitory computer-readable medium, for example, such as computer-readable media that store data for short periods of time, including register memory, processor cache, and Random Access Memory (RAM). The computer-readable medium may also include non-transitory media, such as secondary or persistent long term storage, like read only memory (ROM), optical or magnetic disks, and compact-disc read only memory (CD-ROM), for example. The computer-readable media may also be any other volatile or non-volatile storage systems. The computer-readable medium may be considered a computer-readable storage medium, a tangible storage device, or other article of manufacture, for example.

In addition, for the method 600 and other processes and methods disclosed herein, each block may represent circuitry that is wired to perform the specific logical functions in the process.

As shown, the method 600 begins at block 602 where a wearable computing determines an input gain level of an audio signal at a frequency range. For example, the wearable computing device may receive an audio signal from an audio file via an audio source that provides an audio signal that drives a BCT of the wearable computing device. The wearable computing device may then determine the input gain level of the received audio signal at a frequency range, such as a mid-band frequency range of 800 Hz to 2000 Hz.

At block 604, the wearable computing device compares the determined input gain level at the frequency range to a threshold gain level for that frequency range. The threshold gain level for each frequency band may be determined by tuning each frequency band of an MBC. For example, the mid-band frequency range of 800 Hz to 2000 Hz may be tuned to find the appropriate gain level at which tickling sensations or uncomfortable vibrations experienced by a wearer are limited. A frequency range below 800 Hz (i.e. the low-band) and a frequency range above 2000 Hz (i.e. the high-band) may be tuned as well.

The threshold gain level at each frequency band may take a number of forms. For example, the threshold gain level may be approximately equal to a measured gain level at which a wearer experiences tickling sensations or uncomfortable vibrations from a BCT of a wearable computing device. The threshold gain level may be measured in decibels relative to full scale (dBFS). The unit, dBFS, measures the decibel amplitude levels in digital systems which have a defined maximum available peak level (i.e. 0 dBFS is assigned to the maximum possible digital level). Alternatively, the threshold gain level may be measured in voltage (volts or dBv).

The method 600 continues at block 606 where, based on the comparison, the wearable computing device applies an MBC configured to process the audio signal to reduce gain in at least a portion of a mid-band frequency range of the audio signal. The MBC may be similarly configured to the MBC described for HMD 102 in FIG. 1A. For example, if the input gain level of the audio signal at a mid-band frequency range is greater than the threshold gain level at the mid-band, the MBC may be applied to process and reduce gain of the audio signal at the mid-band frequency range. More specifically, the MBC may be applied to process and reduce gain of the audio signal in the mid-band frequency range of 800 Hz to 2000 Hz. Other examples are possible as well.

In some embodiments, an MBC may be applied to at least a portion of a low-band or high-band frequency range of the audio signal, in addition to being applied to the mid-band. For example, a single MBC may be applied to reduce gain of an audio signal in the mid-band frequency range of 800 Hz to 2000 Hz, and increase gain in at least a portion of the audio signal in the high-band frequency range above 2000 Hz. In another example, a single MBC may be applied to reduce gain of an audio signal in the mid-band frequency range of 800 Hz to 2000 Hz, and increase or reduce gain in at least a portion of the audio signal in the low-band frequency range below 800 Hz. Alternatively, one MBC may be applied to reduce gain of an audio signal in the mid-band frequency range, while a second MBC may be applied to increase gain of an audio signal in the high-band frequency range. Other examples are possible. In either case, the threshold gain level at a low-band or high-band frequency range may be different from the threshold gain level at the mid-band frequency range.

At block 608, the wearable computing device drives a BCT of the wearable computing device with the processed audio signal. The wearable computing device may include at least one audio source that is configured to provide an audio signal that drives the BCT. For instance, in an exemplary embodiment, a wearable computing device may include an internal audio playback device such as an on-board computing system that is configured to play digital audio files. Additionally or alternatively, the wearable computing device may include an audio interface to an auxiliary audio playback device, such as a portable digital audio player, a smartphone, a home stereo, a car stereo, and/or a personal computer, among other possibilities.

It will be understood that the example implementation described above is merely illustrative and is not meant to be limiting. In particular, wearable computing devices, BCTs, and MBCs other than those described above are possible as well.

6. Conclusion

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

I claim:

1. A wearable computing device comprising:
a bone conduction transducer (BCT) configured to receive and be driven by an audio signal;
a processor; and
a data storage comprising instructions executable by the processor to:
determine an input gain level of the audio signal at a frequency range, wherein at least a portion of the frequency range is outside of a mid-band frequency range;
compare the determined input gain level at the frequency range to a threshold gain level at the frequency range;
based on the comparison, apply a multi-band compressor (MBC) configured to process the audio signal to reduce gain in at least a portion of the mid-band frequency range of the audio signal; and
drive the BCT with the processed audio signal.

2. The device of claim 1, wherein the date storage further comprises instructions executable by the processor to determine the input gain level at the frequency range is greater than the threshold gain level at the frequency range.

3. The device of claim 1, wherein the data storage further comprises instructions executable by the processor to determine the input gain level at the frequency range is less than the threshold gain level at the frequency range.

4. The device of claim 3, wherein the MBC is further configured to process the audio signal to modify gain in at least a portion of a low-band frequency range of the audio signal.

5. The device of claim 1, wherein the date storage further comprises instructions executable by the processor to:
receive input data that indicates that the BCT is causing an uncomfortable vibration to a wearer;
based on the received input data, apply the MBC configured to process the audio signal to reduce gain in at least a portion of the mid-band frequency range of the audio signal; and
drive the BCT with the processed audio signal.

6. The device of claim 5, wherein the received input data comprises speech data that corresponds to speech of the wearer indicating that the BCT is causing the uncomfortable vibration.

7. The device of claim 1, wherein the mid-band frequency range of the audio signal is from 800 Hz to 2000 Hz.

8. The device of claim 1, wherein the MBC is further configured to process the audio signal to modify gain in at least a portion of a high-band frequency range of the audio signal.

9. A method comprising:
determining, via a wearable computing device, an input gain level of an audio signal at a frequency range, wherein at least a portion of the frequency range is outside of a mid-band frequency range;
comparing the determined input gain level at the frequency range to a threshold gain level at the frequency range;
based on the comparison, applying a multi-band compressor (MBC) configured to process the audio signal to reduce gain in at least a portion of the mid-band frequency range of the audio signal; and
driving a bone conduction transducer (BCT) with the processed audio signal.

10. The method of claim 9, wherein comparing the determined input gain level at the frequency range to the threshold gain level at the frequency range further comprises determining that the input gain level at the frequency range is greater than the threshold gain level at the frequency range.

11. The method of claim 9, wherein comparing the determined input gain level at the frequency range to the threshold gain level at the frequency range further comprises determining that the input gain level at the frequency range is less than the threshold gain level at the frequency range.

12. The method of claim 9, wherein the MBC is further configured to process the audio signal to increase gain in at least a portion of a low-band frequency range of the audio signal.

13. The method of claim 9, further comprising:
receiving input data that indicates that the BCT is causing an uncomfortable vibration to a wearer;
based on the received input data, applying the MBC configured to process the audio signal to reduce gain in at least a portion of a mid-band frequency range of the audio signal; and
driving the BCT with the processed audio signal having reduced gain in at least the portion of the mid-band frequency range.

14. The method of claim 13, wherein receiving input data that indicates that the BCT is causing the uncomfortable vibration to the wearer further comprises receiving speech data, wherein the speech data corresponds to speech of the wearer indicating that the BCT is causing the uncomfortable vibration.

15. The method of claim 9, wherein the mid-band frequency range of the audio signal is from 800 Hz to 2000 Hz.

16. The method of claim 9, wherein the MBC is further configured to process the audio signal to modify gain in at least a portion of a low-band frequency range of the audio signal.

17. A non-transitory computer readable storage medium having stored therein instructions, that when executed by a wearable computing device, cause the wearable computing device to perform functions comprising:
determining an input gain level of an audio signal at a frequency range, wherein at least a portion of the frequency range is outside of a mid-band frequency range;
comparing the determined input gain level at the frequency range to a threshold gain level at the frequency range;
based on the comparison, applying a multi-band compressor (MBC) that processes the audio signal to reduce gain in at least a portion of the mid-band frequency range of the audio signal; and
driving a bone conduction transducer (BCT) with the processed audio signal.

18. The non-transitory computer readable storage medium of claim 17, wherein comparing the determined input gain level at the frequency range to a threshold gain level at the frequency range further comprises determining that the input gain level at the frequency range is greater than the threshold gain level at the frequency range.

19. The non-transitory computer readable storage medium of claim 17, wherein comparing the determined input gain level at the frequency range to a threshold gain level at the frequency range further comprises determining that the input gain level at the frequency range is less than the threshold gain level at the frequency range.

20. The non-transitory computer readable storage medium of claim 17, wherein the MBC is further configured to process the audio signal to increase gain in at least a portion of a low-band frequency range of the audio signal.

21. The non-transitory computer readable storage medium of claim 17, further comprising:
   receiving input data that indicates that the BCT is causing an uncomfortable vibration to a wearer;
   based on the received input data, applying the MBC configured to process the audio signal to reduce gain in at least a portion of a mid-band frequency range of the audio signal; and
   driving the BCT with the processed audio signal having reduced gain in at least the portion of the mid-band frequency range.

22. The non-transitory computer readable storage medium of claim 17, wherein the mid-band frequency range of the audio signal is from 800 Hz to 2000 Hz.

23. The non-transitory computer readable storage medium of claim 17, wherein the MBC is further configured to process the audio signal to modify gain in at least a portion of a low-band frequency range of the audio signal.

24. The wearable computing device of claim 1, wherein input gain levels above the threshold gain level indicate a likelihood that an uncomfortable touch sensation would be caused by output of the audio signal by the BCT, and wherein the comparison indicates the determined input gain level is above the threshold gain level.

25. The wearable computing device of claim 24, wherein the uncomfortable touch sensation is a tickling sensation.

26. The wearable computing device of claim 1:
   wherein input gain levels above the threshold gain level indicate a likelihood that an uncomfortable touch sensation would be caused by output of the audio signal by the BCT;
   the device further comprising instructions executable by the processor to:
      based on the comparison, determine the input gain level at the frequency range is above the threshold gain level and responsively apply the MBC to process the audio signal to reduce gain in at least a portion of the mid-band frequency range of the audio signal.

* * * * *